(12) United States Patent
Chen et al.

(10) Patent No.: US 7,838,428 B2
(45) Date of Patent: Nov. 23, 2010

(54) METHOD OF REPAIRING PROCESS INDUCED DIELECTRIC DAMAGE BY THE USE OF GCIB SURFACE TREATMENT USING GAS CLUSTERS OF ORGANIC MOLECULAR SPECIES

(75) Inventors: Shyng-Tsong Chen, Patterson, NY (US); Nancy R. Klymko, Hopewell Junction, NY (US); Anita Madan, Danbury, CT (US); Sanjay Mehta, Niskayuna, NY (US); Steven E. Molis, Patterson, NY (US)

(73) Assignee: International Business Machines Corporation, Armonk, NY (US)

( * ) Notice: Subject to any disclaimer, the term of this patent is extended or adjusted under 35 U.S.C. 154(b) by 648 days.

(21) Appl. No.: 11/609,040

(22) Filed: Dec. 11, 2006

(65) Prior Publication Data

US 2007/0224824 A1    Sep. 27, 2007

Related U.S. Application Data

(63) Continuation-in-part of application No. 11/308,422, filed on Mar. 23, 2006.

(51) Int. Cl.
*H01L 21/311* (2006.01)
(52) U.S. Cl. ............... 438/700; 438/637; 257/E23.145
(58) Field of Classification Search .......... 257/E23.145, 257/E23.15, E23.148; 438/700, 637, 409, 438/960, 618
See application file for complete search history.

(56) References Cited

U.S. PATENT DOCUMENTS

| | | | |
|---|---|---|---|
| 5,814,194 A | 9/1998 | Deguchi et al. | |
| 5,970,376 A * | 10/1999 | Chen | 438/637 |
| 6,284,644 B1 * | 9/2001 | Aug et al. | 438/623 |
| 6,613,240 B2 | 9/2003 | Skinner et al. | |
| 7,538,028 B2 * | 5/2009 | Sandu et al. | 438/638 |
| 2003/0232495 A1 * | 12/2003 | Moghadam et al. | 438/623 |

(Continued)

OTHER PUBLICATIONS

Hautala et al., "Infusion Processing: An Alternative to Plasma Technology for Semiconductor Device Manufacturing", Electrochemical Society Symposium on ULSI Process Integration IV, May 2005, Quebec, Canada, PV Jun. 2005, p. 118.

(Continued)

*Primary Examiner*—Thao P. Le
(74) *Attorney, Agent, or Firm*—Wenjie Li; Hoffman Warnick LLC

(57) ABSTRACT

When an interconnect structure is built on porous ultra low k (ULK) material, the bottom and/or sidewall of the trench and/or via is usually damaged by a following metallization or cleaning process which may be suitable for dense higher dielectric materials. Embodiments of the present invention may provide a method of repairing process induced dielectric damage from forming an interconnect structure on an interlayer dielectric (ILD) material. The method includes treating an exposed area of the ILD material to create a carbon-rich area, and metallizing the carbon-rich area. One embodiment includes providing treatment to an exposed sidewall area of the ILD material to create a carbon-rich area by irradiating the exposed area using a gas cluster ion beam (GCIB) generated through a gas including a straight chain or branched, aliphatic or aromatic hydrocarbon, and metallizing the carbon-rich area.

10 Claims, 11 Drawing Sheets

U.S. PATENT DOCUMENTS

| | | | |
|---|---|---|---|
| 2005/0087516 A1* | 4/2005 | Duerksen et al. | 216/62 |
| 2005/0087769 A1 | 4/2005 | Yamazaki et al. | |
| 2005/0127417 A1* | 6/2005 | Saenger et al. | 257/295 |
| 2005/0266691 A1 | 12/2005 | Gu et al. | |
| 2005/0272237 A1* | 12/2005 | Hautala et al. | 438/597 |
| 2005/0272265 A1* | 12/2005 | Geffken et al. | 438/706 |
| 2006/0046472 A1* | 3/2006 | Sandhu et al. | 438/653 |
| 2007/0042609 A1* | 2/2007 | Senkevich et al. | 438/778 |
| 2007/0117342 A1* | 5/2007 | Chen et al. | 438/401 |
| 2007/0125747 A1 | 6/2007 | Otsuka et al. | |
| 2007/0173071 A1* | 7/2007 | Afzali-Ardakani et al. | 438/781 |
| 2007/0275569 A1* | 11/2007 | Moghadam et al. | 438/781 |
| 2009/0072401 A1* | 3/2009 | Arnold et al. | 257/751 |
| 2009/0087577 A1* | 4/2009 | Russell et al. | 427/523 |
| 2009/0098186 A1* | 4/2009 | Kirkpatrick et al. | 424/424 |

OTHER PUBLICATIONS

U.S. Appl. No. 11/308,422, "Office Action", dated Mar. 30, 2009, 8 pages.

U.S. Appl. No. 11/308,422, "Final Office Action", dated Sep. 22, 2009, 10 pages.

U.S. Appl. No. 11/308,422, "Office Action", dated Jan. 7, 2010, 9 pages.

* cited by examiner

METHOD OF REPAIRING PROCESS INDUCED DIELECTRIC DAMAGE BY THE USE OF GCIB SURFACE TREATMENT USING GAS CLUSTERS OF ORGANIC MOLECULAR SPECIES

CROSS-REFERENCE TO RELATED APPLICATION

This application is a CIP of U.S. application Ser. No. 11/308,422 filed Mar. 23, 2006.

FIELD OF THE INVENTION

The current invention relates to the field of semiconductor device manufacturing. In particular, it relates to a process of providing treatment to surfaces of an interconnect structure after etching and before metallization.

BACKGROUND OF THE INVENTION

Recent rapid advancement in semiconductor technology has brought the advent of very large scale integrated (VLSI) as well as ultra large scale integrated (ULSI) circuitries, resulting in integration of more devices into smaller areas on a single semiconductor substrate. In order to further enhance performance of the VLSI and/or ULSI circuitries, ultra-low dielectric constant (ULK) materials, such as porous materials, are being used as inter-layer dielectric (ILD) to further reduce capacitance such as, for example, inter-layer capacitance and/or other parasitic capacitance that may be undesirable to the performance such as speed of the VLSI and/or ULSI circuitries. Interconnect structures made of metal lines or contacts, such as copper (Cu) for example, are usually formed in and around the porous ULK ILD to connect semiconductor devices on the substrate.

An interconnect structure, which may include trenches and vias, may be formed by first creating a pattern of a three-dimensional interconnect structure in the ILD of a porous ULK material. As is known in the art, the structure or pattern may be formed through processes such as lithography and etching, e.g., a reactive ion etching (RIE). Subsequently, a metal element or material may be deposited onto the trenches and/or vias of the formed structure pattern to create metal contact lines. Excess metal being deposited on the surface of the ULK ILD may be removed through a chemical mechanical planarization (CMP) process. On the other hand, it is also known in the art that depositing a Cu barrier metal (liner), such as Ta/TaN, onto a surface of a porous ULK ILD using a conventional surface cleaning process designed or optimized for dense ILD build may cause element of the metal to penetrate or intrude into the porous material of the ULK ILD. This penetration or intrusion of metal element into porous ULK ILD may cause performance degradation of the metal contacts formed thereon and, in a worst case, shorting of the semiconductor devices that the interconnect structure intends to connect.

In addition to the above-described problems, due to high volume fraction of pores, the trench and via sidewalls of the porous ULK dielectrics are prone to significantly greater damage in the sidewalls relative to the dense low-k dielectrics from the conventional cleaning process, e.g., using oxidative plasma ash chemistries. As such, reducing ash chemistries are often used to remove residual photoresist for these levels with porous dielectrics. Even with these reducing ash chemistries, the damage is significant. Consequently, in the integration scheme that utilizes a single or dual hardmask approach to protect the underlying ULK dielectric from damage during lithography rework, a large lateral undercut is caused in the ULK dielectric directly below the hardmask during a wet clean process step post-etch. This undercut presents a challenge for the physical vapor deposition (PVD) of the Cu barrier metal (liner). Further, the feature profile is modified post-wet etch (damage removal) due to uneven nature of the sidewall damage. For example, larger damage is observed toward the top of the opening and reduced damage is observed toward the bottom of the opening leading to tapered trench sidewall profiles, impacting the performance.

SUMMARY OF THE INVENTION

One embodiment of the current invention provides a process and method of densifying exposed areas of a porous ULK material at the bottom surfaces of an interconnect structure. The surface treatment of densification may be performed through irradiation, and the irradiation may be conducted by applying a Gas Cluster Ion Beam (GCIB).

According to one embodiment of the invention, the size of a typical gas cluster used in the GCIB process may be around, e.g., 5 nm, which is bigger than the size of a typical pore, which is around, e.g., 1~2 nm, inside a porous ULK material. Therefore, surface treatment by a GCIB process may not cause changes in the property of the bulk ULK material. In the mean time, the GCIB surface treatment may create a smooth layer of densified surface in the ULK dielectric material. According to one embodiment of the invention, the thickness of a densified layer may be controlled preferably by an acceleration voltage used in the GCIB process. According to another embodiment, the thickness of a densified layer may be from 10 Å to 500 Å, and may be preferably in the range of 50 Å-250 Å.

After the surface treatment through densification, a conventional metallization process may follow by first cleaning the surface of the interconnect structure, and then depositing a metal liner followed by a metal filler in the trench and/or via areas of the interconnect structure. Because the metallization process will now experience a "dense" ILD at the bottom of the trench and/or via, it may not cause roughness to the bottom surface or elements of the metal liner to intrude or penetrate into the underneath porous ULK ILD material. After the build of the interconnect structure is completed, the densified layer may remain inside the porous ILD material. In addition, embodiment of the present invention may enable a dual damascene build for both metal line and via in a porous ULK ILD material.

Embodiments of the present invention provide a process or method of forming an interconnect structure on an inter-layer dielectric material. The method includes steps of providing treatment to an exposed area of the ILD material to create a densified area, and metallizing the densified area.

According to one embodiment, the exposed area is a bottom surface of a trench created in the ILD material. According to another embodiment, the exposed area is part of a bottom surface of a trench or via created in the ILD material.

According to embodiments of the invention, the ILD material may be a porous material of ultra-low dielectric constant (ULK), and may be a silicon dioxide ($SiO_2$), a silicon oxycarbide (SiCOH), a methylsilsesquioxane (MSQ), a hydrosilsequioxane, a hydrogenated amorphous silicon carbide (SiCH), a hydrogenated amorphous silicon carbon nitride (SiCNH), or a silicon nitride (SiNx).

Embodiments of the present invention may further provide a method of treating the exposed area of the ILD material by irradiating the exposed area using a GCIB.

According to one embodiment, the GCIB may be used at a dosage of approximately between 0.1 and $10.0\times10^{15}$ ion-clusters/cm$^2$, and preferably between 0.5 and $2.5\times10^{15}$ ion-clusters/cm$^2$.

According to another embodiment, the GCIB may be accelerated at a voltage of approximately between 1.0 and 60 KeV, and preferably between 5 and 15 KeV.

According to yet another embodiment, the GCIB may be generated through a pure or a mixture of inert and reactive gases. The inert gases may include one or more gases of argon, neon, krypton, xenon, radon, nitrogen, and oxygen.

According to one embodiment of the invention, the densified area may have a layer of thickness from 10 Å to 500 Å, and preferably from 50 Å to 250 Å.

Embodiments of the present invention may further provide a method of forming a bottom surface of the interconnect structure to create an exposed area of the ILD material.

Embodiments of the present invention may provide an interconnect structure in a semiconductor chip for connecting one or more semiconductor devices. The interconnect structure may include at least one densified area on a surface of an ILD material, and the densified area may be formed through irradiation treatment of the ILD material with a GCIB.

According to one embodiment, the densified area may include a bottom surface of a trench formed in the ILD material. According to another embodiment, the densified area may include part of a bottom surface of a via created in the ILD material.

According to one embodiment, the interconnect structure may further include a metal liner deposited on top of the densified area and a metal filler deposited on top of the metal liner, and the ILD material may be a silicon dioxide (SiO2), silicon oxycarbide (SiCOH), methylsilsesquioxane (MSQ), hydrosilsequioxane, hydrogenated amorphous silicon carbide (SiCH), hydrogenated amorphous silicon carbon nitride (SiCNH), or silicon nitride (SiNx).

Embodiments of the invention may provide a semiconductor device having at least one interconnect structure formed on an ILD material. The interconnect structure may include one or more densified areas formed on one or more bottom surfaces of the interconnect structure.

According to one embodiment, at least one of the densified areas may form a layer, and the layer may have a thickness from 10 Å to 500 Å, and preferably from 50 Å to 250 Å.

Embodiments of the invention may further provide a method of repairing process induced dielectric damage during forming of an interconnect structure in an inter-layer dielectric (ILD) material in which a treatment is provided to an exposed sidewall area of the ILD material to create a carbon-rich area by irradiating the exposed sidewall area with a gas cluster ion beam (GCIB) generated through a gas including molecular species such as a straight chain or branched, aliphatic or aromatic hydrocarbon. The treatment incorporates carbon in the damaged dielectric along the exposed sidewall area. According to one embodiment, the aliphatic hydrocarbon is selected from, but not limited to: methane (CH4) ethane (C2H6), propane (C3H8) and/or ethylene (C2H4). According to one embodiment, the gas may further include an inert gas such as one or more gases of argon and krypton.

According to one embodiment, the ILD material may include a porous material of an ultra-low dielectric constant (ULK), where the ILD material may include silicon oxycarbide (SiCOH), methylsilsesquioxane (MSQ), hydrosilsesquioxane, hydrogenated amorphous silicon carbide (SiCH), hydrogenated amorphous silicon carbon nitride (SiCNH), and/or silicon nitride (SiNx).

According to one embodiment, the GCIB irradiating comprises applying the GCIB at a dosage of approximately between 0.1 and $10.0\times10^{15}$ ion-clusters/cm$^2$. Further, according to one embodiment, the GCIB irradiating comprises accelerating the GCIB at a voltage of approximately between 5.0 and 60 KeV, and preferably between 5 and 30 KeV.

According to one embodiment, the method may further comprise stabilizing the carbon-rich area by exposing the carbon-rich area to irradiation in a temperature between 200 and 400° C. In this case, the irradiation may include e-beam irradiation having a landing energy higher than a bond-breaking energy of Si—OH, SiH or Si—CH3. Alternatively, where the irradiation may includes ultra-violet (UV) irradiation having a wavelength between 170 and 300 nm, with a preferred range of wavelength between 190 and 250 nm.

According to one embodiment, the exposed sidewall area is substantially hydrophobic after the treatment.

Embodiments of the invention also may provide a semiconductor device, comprising at least one interconnect structure formed on an inter-layer dielectric (ILD) material, the interconnect structure having one or more carbon-rich areas formed on a sidewall surface of the interconnect structure.

BRIEF DESCRIPTION OF THE DRAWINGS

The present invention will be understood and appreciated more fully from the following detailed description of the invention, taken in conjunction with the accompanying drawings of which.

Figure 1:
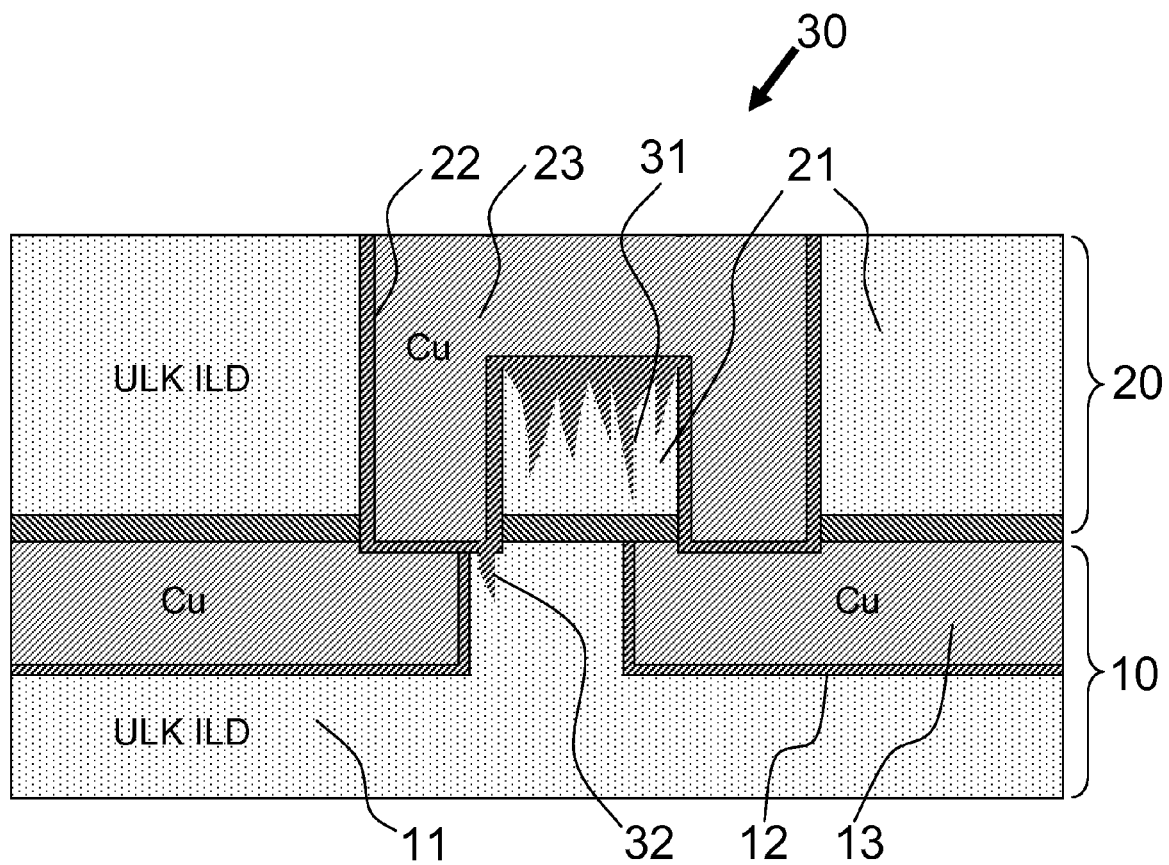
FIG. 1 is a schematic illustration of a conventional interconnect structure as is known in the art.

It will be appreciated that for simplicity and clarity of illustration, elements shown in the drawings have not necessarily been drawn to scale. For example, the dimensions of some of the elements may be exaggerated relative to other elements for clarity purpose.

DETAILED DESCRIPTION OF THE INVENTION

As is known in the art, manufacture of a semiconductor device may include processing of, for example, a front end of line (FEOL) and a back end of line (BEOL). During a FEOL processing, semiconductor devices such as, for example, switches and logic gates may be produced. These devices may be interconnected through one or more interconnect structures. The interconnect structures may be produced through a BEOL processing.

A conventional BEOL processing may include steps such as, for example, cap deposition, ILD deposition, hard mask or photo-mask deposition, lithography, and etching, among other steps. For the interest of not obscuring the presentation of the essences of present invention, processing steps that are well known in the art may not be described below in detail, but rather the following description will focus on the distinctive elements of the present invention.

FIG. 1 is a schematic illustration of an interconnect structure as is known in the art. Interconnect structure 30 may be created in an ULK ILD layer 20, which may be formed on top of a prior ULK ILD layer 10. ULK ILD Layer 10 may include a porous material 11, and thereon may be formed one or more interconnect structures such as, for example, metal contact or metal filler 13 deposited or filled on top of barrier metal film or liner 12. Similarly, ULK ILD layer 20 may include a porous material 21. Interconnect structure 30 may include metal contact or metal filler 23 filled or deposited on top of barrier metal film or liner 22.

During a metallization process, due to a plasma cleaning process which is typically employed in the creating of interconnections in a dense ILD material, in and around an area between metal contact 23 and porous material 21, there may be formed a liner 22 which may not have a smooth surface and often have a rough interface with porous material 21 underneath it. As is known in the art, the surface of porous material 21 may be damaged during the plasma cleaning process and spike-like extrusions such as, for example, "spikes" 31 and 32 as illustrated in FIG. 1 may penetrate into porous material 21 underneath liner 22. In other words, metal elements of liner 22 may penetrate into "holes" of porous ULK material 21. This roughness between the metal interconnect structure 30 and its underlining inter-layer dielectric may cause performance degradation of the metal contact or interconnect. For example, in one instance, a deep "spike" may cause shortage among different semiconductor devices.

Figure 2:
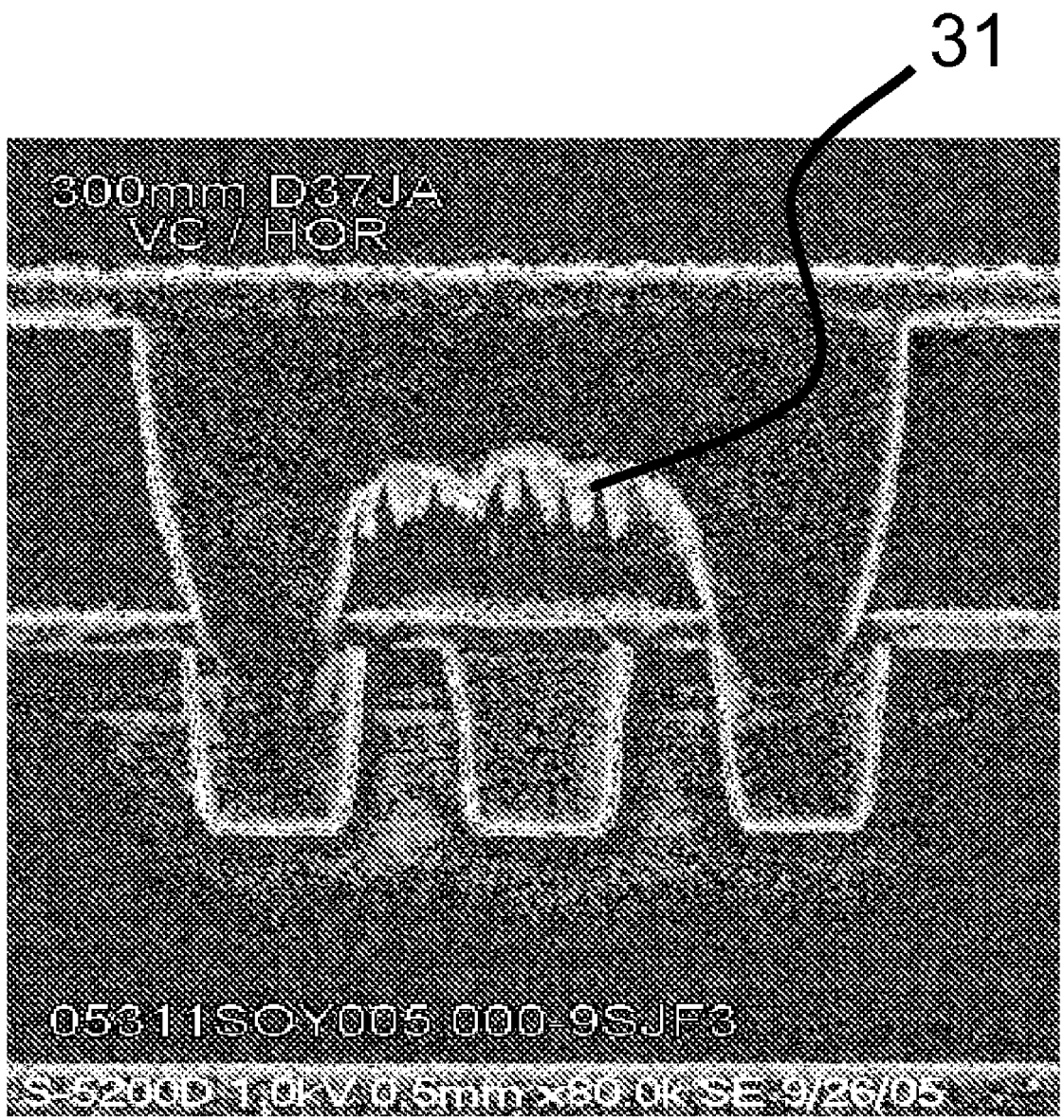
FIG. 2 is an illustration of a sample interconnect structure formed by following a conventional process as is known in the art.

FIG. 2 is an illustration of a sample interconnect structure formed by following a conventional process as is known in the art. As described above with regard to FIG. 1, due to the porous nature of ULK material of the ILD layer, a plasma sputtering clean action or process, which is normally applied to the surface before the deposition of a barrier metal film or liner for the formation of trenches and vias, caused damages to the porous material. This results in the roughness of metal liner at the surface of the ILD layer forming the bottom of a trench, as evidenced by extrusion or "spike" 31.

Figure 3:
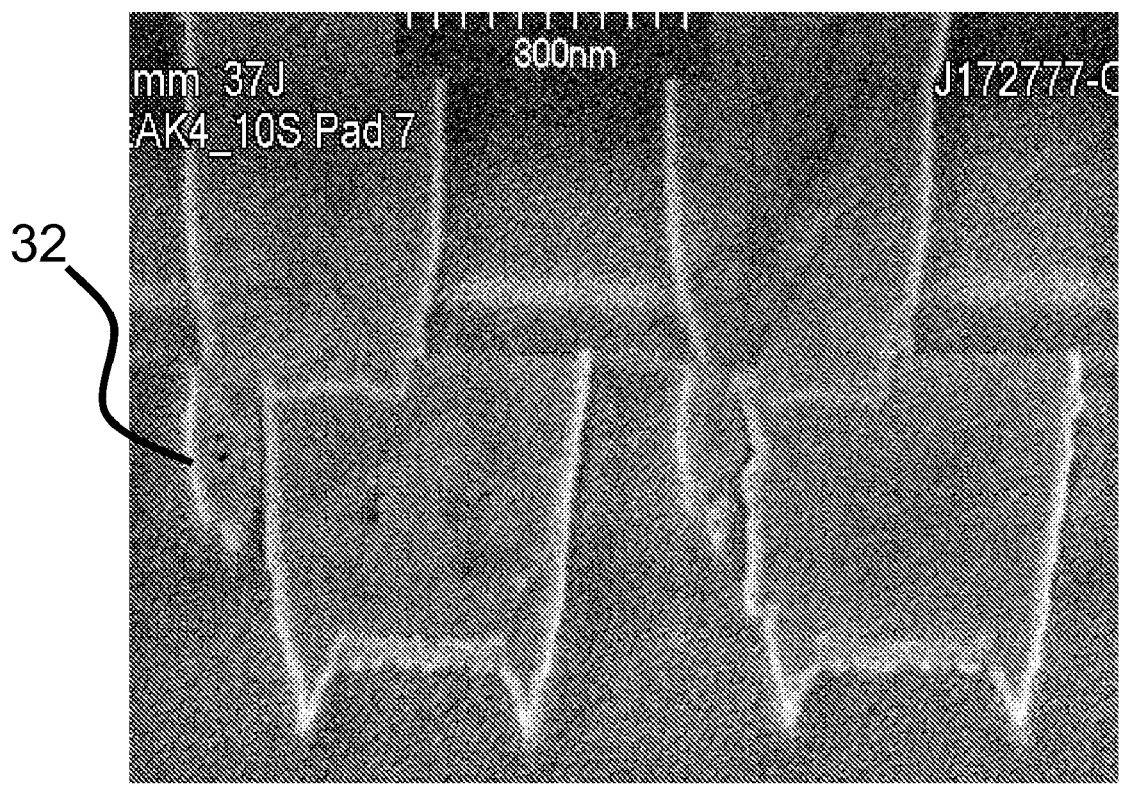
FIG. 3 is an illustration of another sample interconnect structure formed by following a conventional process as is known in the art.

FIG. 3 is an illustration of another sample interconnect structure formed by following a conventional process as is known in the art. As described above with regard to FIG. 1, the existence of extrusion or "spike" 32 in FIG. 3 indicates that metal elements of a barrier metal file or liner of an interconnect structure in the current (top) ULK ILD layer may have penetrated or intruded into the porous material of a prior (bottom) ULK ILD layer. The porous material of bottom ULK ILD layer may have been exposed at the bottom of the via of the interconnect structure in the top ULK ILD layer, due to a misalignment, between the two different ILD layers, caused during the patterning process of vias.

According to embodiments of the invention, issues relating to metal intrusion into a neighboring porous ULK ILD layer may be resolved by applying a post RIE surface treatment of the ILD layer. The surface treatment may be applied after an area for interconnect structure is created through etching but before a subsequent conventional metallization process is applied. According to one embodiment of the invention, the surface treatment may seal at least some pores of the ULK ILD layer, and therefore may increase a density of the ULK material in a region close to the proximity of the surface, which in turn may enhance resistance of the surface to possible chemical and mechanical damages caused by subsequent processing steps in the formation of the interconnect structure.

Figure 4:
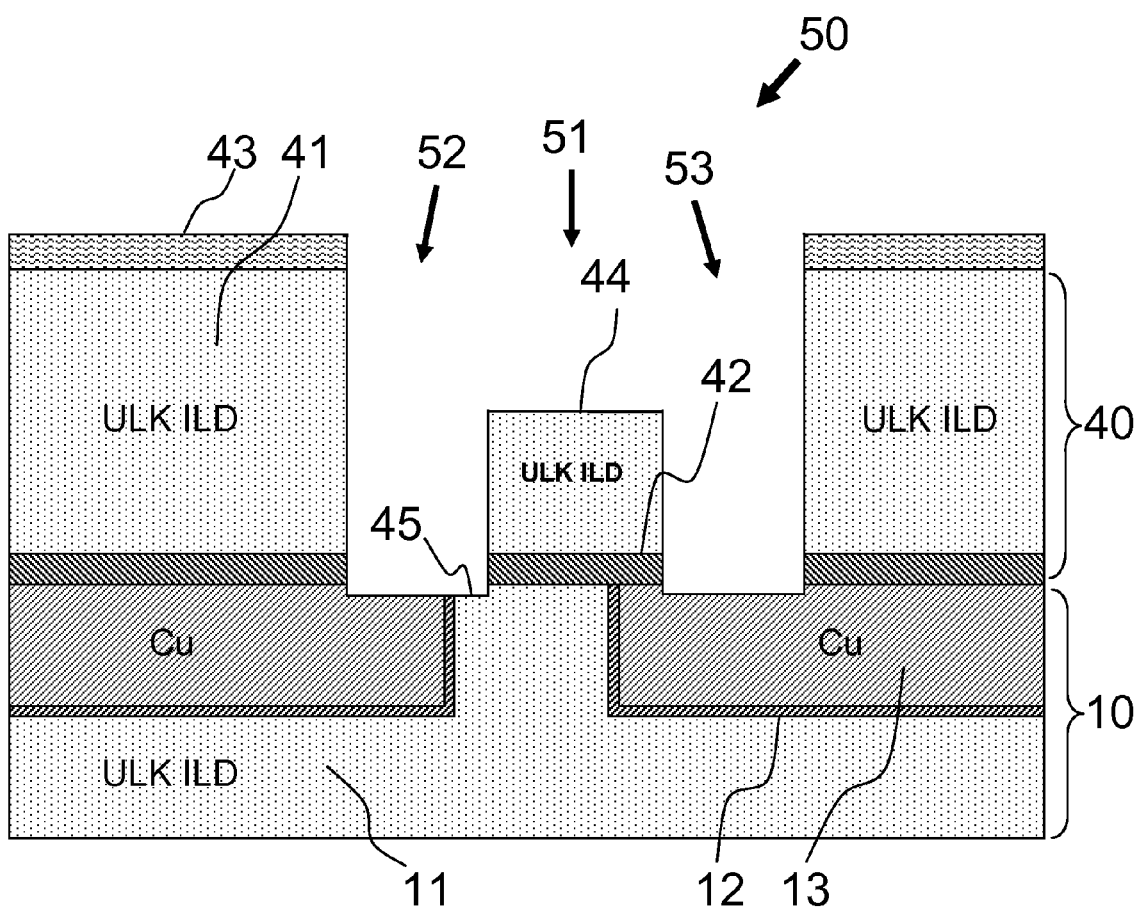
FIG. 4 is a schematic illustration of a method of forming an interconnect structure according to one embodiment of the invention.

FIG. 4 is a schematic illustration of a method of forming an interconnect structure according to one embodiment of the invention. Interconnect structure 50 may be created in a porous ULK ILD layer 40 which may be on top of a porous ULK ILD layer 10 of a prior layer. However, the invention is not limited in this respect and interconnect structure 50 may be created in materials other than a porous material, and layer 40 may or may not be an ULK ILD layer. In addition, ULK ILD layer 40 may or may not be on top of another ULK ILD layer such as ULK ILD layer 10. ULK ILD layer 10 may have an interconnect structure formed thereon such as, for example, a metal contact 13 deposited or plated or filled on top of a barrier metal film or liner 12. However, the invention is not limited in this respect and ULK ILD layer 10 may not be and/or may not necessarily contain any interconnect structures at all.

Interconnect structure 50 may be formed through processing steps as briefly described below. First, a cap layer 42 may be formed on ULK ILD layer 10 through, for example, a sputtering deposition process. On top of cap layer 42, a layer of porous ULK material 41 may be deposited or formed to create an ILD layer. Following the formation or deposition of ULK ILD layer 41, a structure of interconnect structure 50 may be created in ULK ILD layer 41, including a region 51 for forming a trench and regions 52 and 53 for forming vias, through processes such as, for example, selective etching as described below in detail.

For example, a layer of photon-sensitive material may be first applied on top of ULK ILD layer 41. As is known in the art, a lithographic processing technique may be subsequently used to create a photo-mask 43 out of the photon-sensitive layer of material. Photo-mask 43 may include a desired pattern of trenches and/or vias to be created in ULK ILD layer 41.

According to one embodiment of the invention, at least a portion of ULK ILD layer 41 in the area defined by a trench may be subsequently etched away to form a trench region 51. According to another embodiment of the invention, ULK ILD layer 41 and cap layer 42, in areas defined by vias, may be etched away to form regions for vias 52 and 53. According to one embodiment, regions for trench 51 and vias 52 and 53 may be formed partially through same etching steps. But the invention is not limited in this respect and regions for trench 51 and vias 52 and 53 may be formed in different and/or separate steps. The etching may be a reactive ion etching process but the invention is not limited in this respect either, and other etching process such as a wet etching process may be used.

The forming of trench region 51 may create and expose a surface 44 of porous ULK material 41. In addition, misalignment between current and prior levels of interconnect layers in a process of creating vias through lithography may cause exposure of a part of porous ULK material 45 of a prior ILD layer, for example, ULK ILD layer 10, as shown in FIG. 4.

Figure 5:
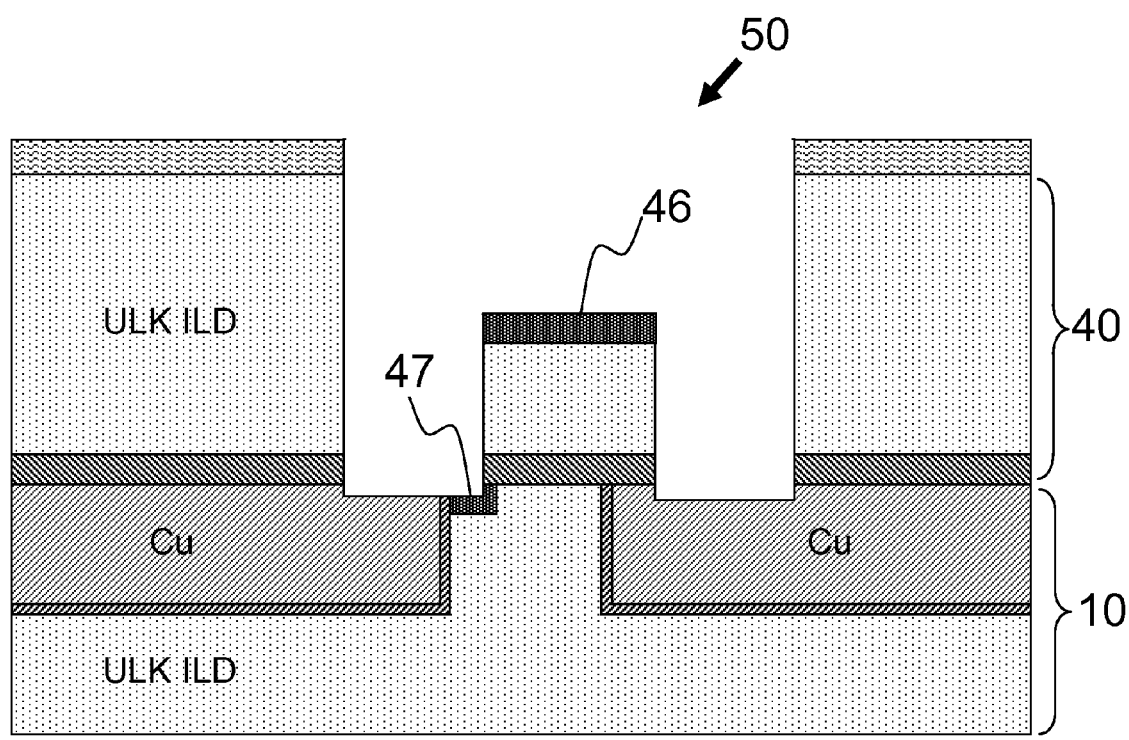
FIG. 5 is a schematic illustration of a method of forming an interconnect structure according to another embodiment of the invention.

FIG. 5 is a schematic illustration of a method of forming an interconnect structure according to another embodiment of the invention. Following the step as described above with regard to FIG. 4 and before applying a conventional metallization process, exposed surfaces of porous materials of layer 10 and layer 40 may be treated, according to one embodiment, to create a layer of densified areas. For example, exposed surfaces 44 and 45 (FIG. 4) of porous materials 41 and 11 may be treated to create densified areas 46 and 47, respectively, which may be subsequently used to prevent metal elements of a liner, such as liner 48 (FIG. 6) to be applied later, from penetrating into porous materials 41 and 11.

Figure 6:
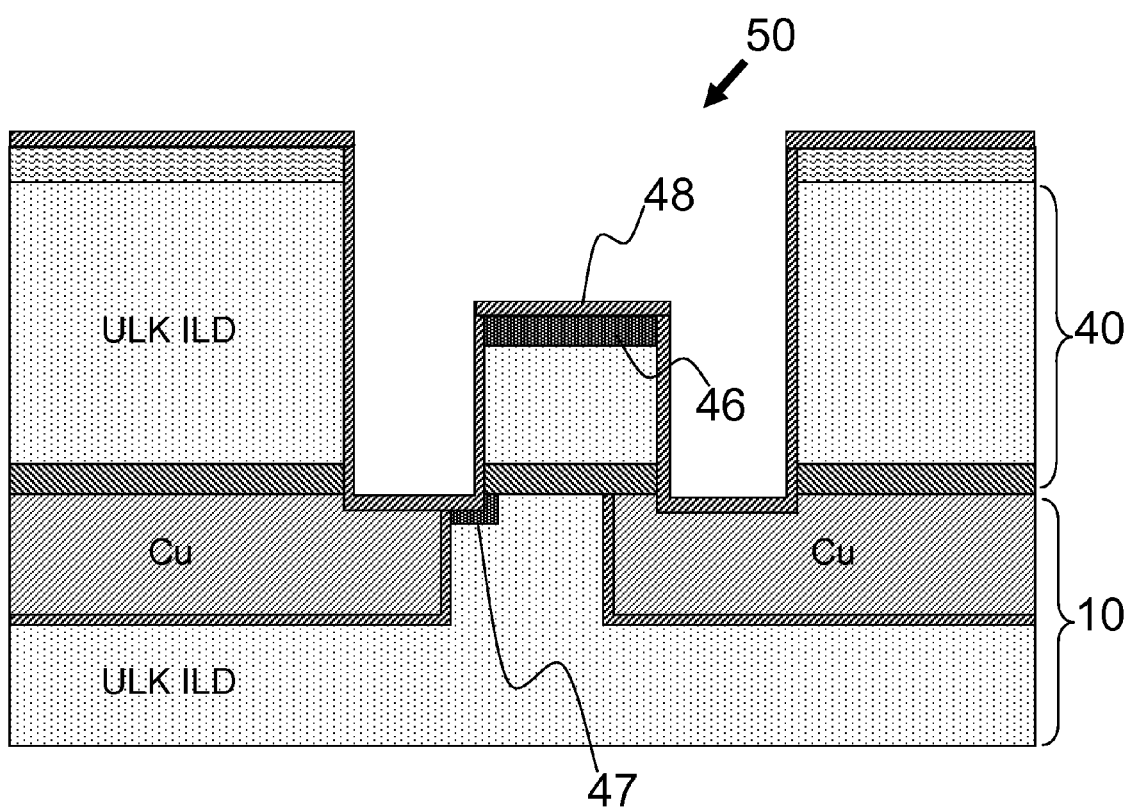
FIG. 6 is a schematic illustration of a method of forming an interconnect structure according to one embodiment of the invention.
Figure 7:
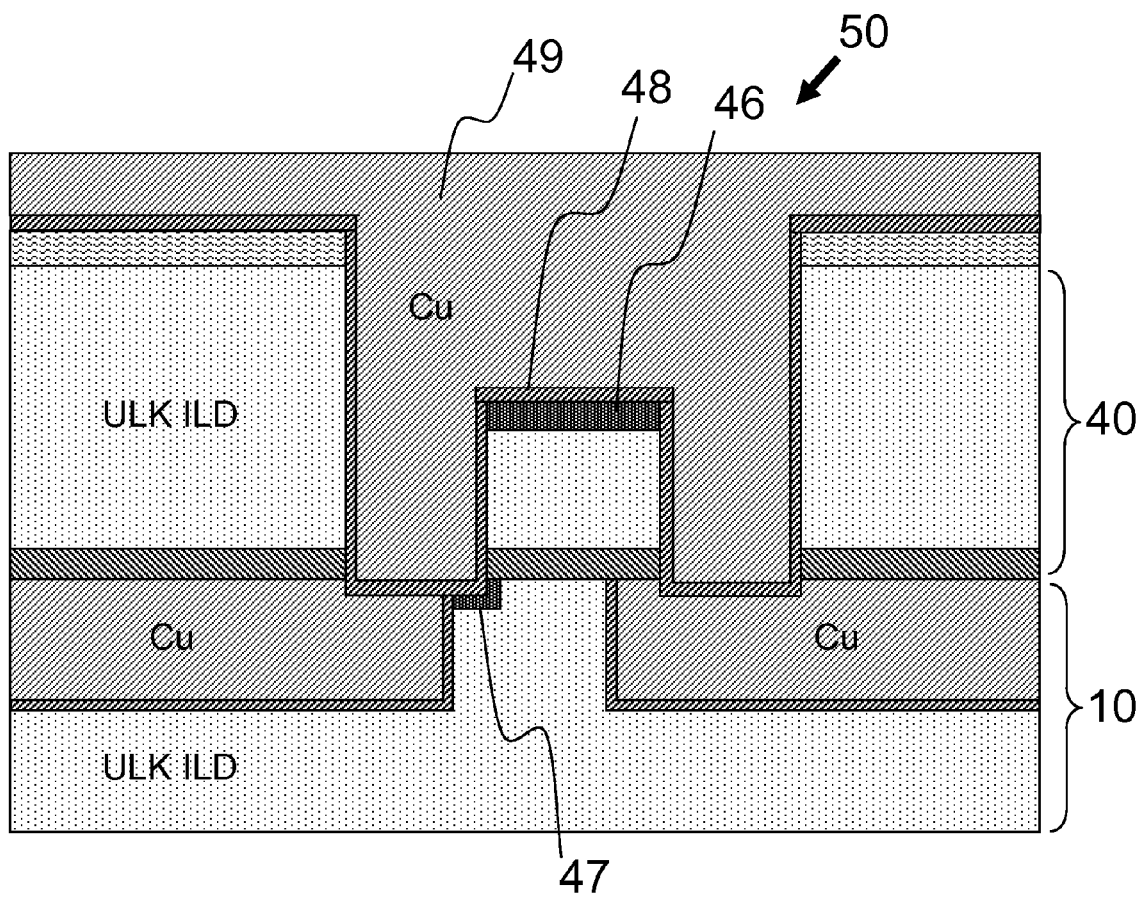
FIG. 7 is a schematic illustration of a method of forming an interconnect structure according to another embodiment of the invention.
Figure 8:
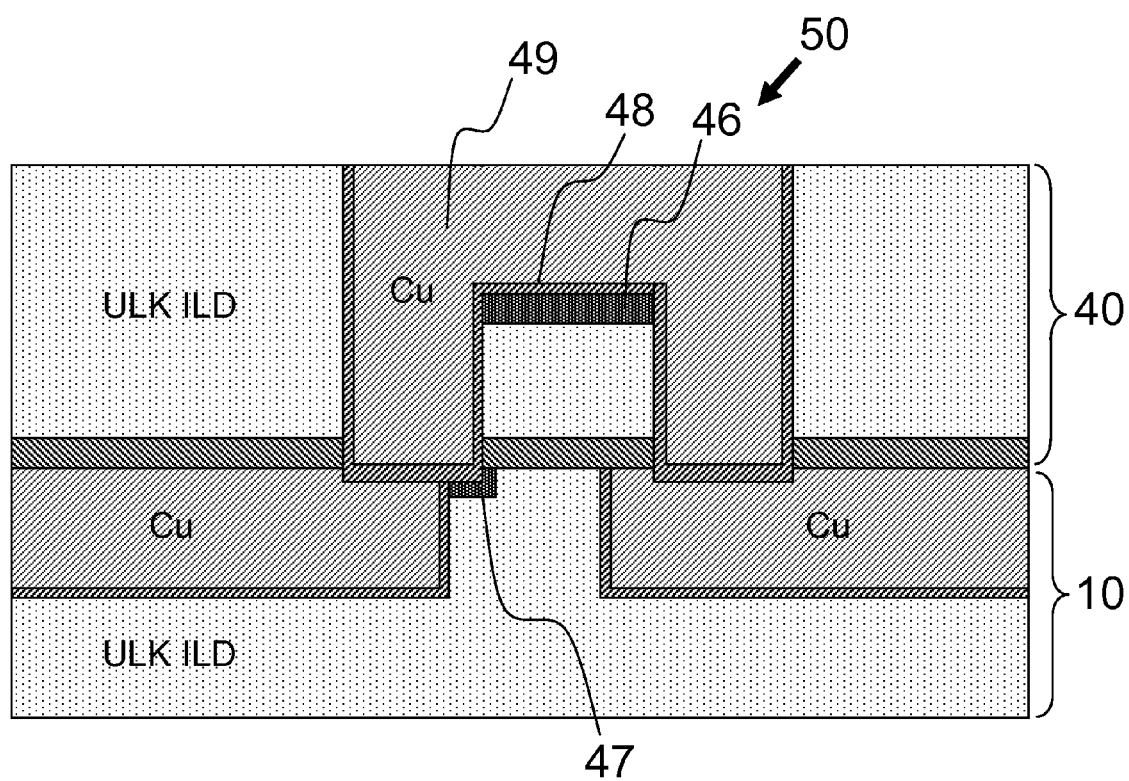
FIG. 8 is a schematic illustration of a method of forming an interconnect structure according to yet another embodiment of the invention.

The surface treatment may be conducted by using a gas cluster ion beam (GCIB) to bombard exposed surfaces of the porous materials. According to one embodiment of the invention, a process of applying GCIB may be a low temperature process where large clusters of ions are used to bombard the surface of the porous materials. The ion beam may be directional, which enables the bombardment of very specific areas of interconnect structure 50 to create densified area 46 upon which a trench is to be formed, and/or densified area 47 upon which a via is formed later, as are illustrated in FIGS. 6-8.

According to some embodiments of the invention, porous ULK materials used as an ILD layer may be designed or selected, and/or to a certain extent optimally selected, to have sizes of pore diameters ranging from, for example, 1-2 nm in order to reduce and/or prevent line to line conduction paths. For porous ULK materials with pore diameters of 1-2 nm, the size of ion clusters used in a GCIB process may be in the order of a few nanometers, for example, 5 nm. However, the invention is not limited in this respect, and the size of the ion clusters may vary depending on, for example, conditions of the GCIB process. In the above case, since the size of the ion clusters is bigger than the size of pore in the porous ULK material, a surface treatment by the GCIB process may densify only a layer of the porous material in proximity to the surface and thus may not cause changes to the property of the bulk ULK material. In comparison, a surface treatment by a conventional plasma process will cause property changes of the bulk porous ULK material in the majority and in worst cases the entire thickness of the ILD layer. This may inadvertently offset some of the advantages of using porous ULK materials as an ILD layer.

As is illustrated in FIG. 5, exposed porous material of ULK ILD such as misaligned via 47 and trench bottom 46 are smoothed through the GCIB densification process. According to one embodiment of the invention, the GCIB process may be adjusted, and/or to a certain extent optimized, by varying a dosage of the ions and/or an accelerating voltage for the ions. In order to reduce, and/or to a certain extent prevent, chemical (etching) or physical (sputtering) removal of the ULK ILD during the GCIB process, benign elements or a mixture of benign and other elements may be used. For example, some ion clusters may include inert gas molecules such as, nitrogen, argon, or other pure gases and/or a mixture of different gases. According to one embodiment, thickness of the densification area or region may be determined by the acceleration voltage of the ion clusters. For example, the thickness of a densified area or region may range between 50-250 Å for BEOL interconnect purposes. However, the invention is not limited in this respect and other thickness may be used for desired performance. As shown in FIG. 5, the post RIE interconnect structure 50 has now densified regions 46 at the bottom of the trench and 47 under the misaligned via.

These densified regions 46 and 47 may be more resistant to possible chemical and/or physical damages which may occur during subsequent processing.

FIG. 6 is a schematic illustration of a method of forming an interconnect structure according to one embodiment of the invention. Following the step as described above with regard to FIG. 5, after the exposed surfaces of porous materials of ULK ILD layers 10 and 40 have been treated by the GCIB process, a barrier metal film or liner 48 may be deposited onto the surfaces including regions, such as regions 51, 52 and 53 (FIG. 4), that are etched away for the formation of trenches and vias. Before the deposition of barrier metal film or liner 48, aggressive sputtering and/or etch processes may be applied to clean up the bottom surfaces of the trenches and vias, including the removal of at least part of the densified surface areas 46 and 47. Thus, the GCIB process treated areas 46 and 47 may withstand an intense processing that is typically used for dense ILD materials. As a result, smooth surfaces at the bottom of interconnect structure 50 may be maintained by densified areas 46 and 47. The barrier metal film or liner 48 deposited subsequently at the trench bottom and in the area of the misaligned via may continue to have a relatively smooth profile.

FIG. 7 is a schematic illustration of a method of forming an interconnect structure according to another embodiment of the invention. Following the step as described above with regard to FIG. 6 after deposition of barrier metal film or liner 48, a metal element 49, for example, copper (Cu) that is suitable for interconnecting semiconductor devices may be deposited or filled in the area etched for interconnect structure 50 and to be used as metal contact. Metal element 49 may fill up interconnect structure 50 and in one embodiment may be excessively deposited onto other parts of ILD layer 40 as shown in FIG. 7.

FIG. 8 is a schematic illustration of a method of forming an interconnect structure according to yet another embodiment of the invention. Following the step as described above with regard to FIG. 7 after filling in interconnect structure 50 with metal element 49, surface of the plated interconnect structure 50 or surface of ILD layer 40 may be subjected to a planarization process such as, for example a CMP process, to remove excess metal element 49 and other processing related layers such as, for example, photo-mask layer 43 (FIG. 4) and/or liner 48 outside interconnect structure 50. In addition, the CMP process may prepare the surface of ILD layer 40 for a further processing such as, for example, for the formation of a subsequent layer of interconnect.

Figure 9:
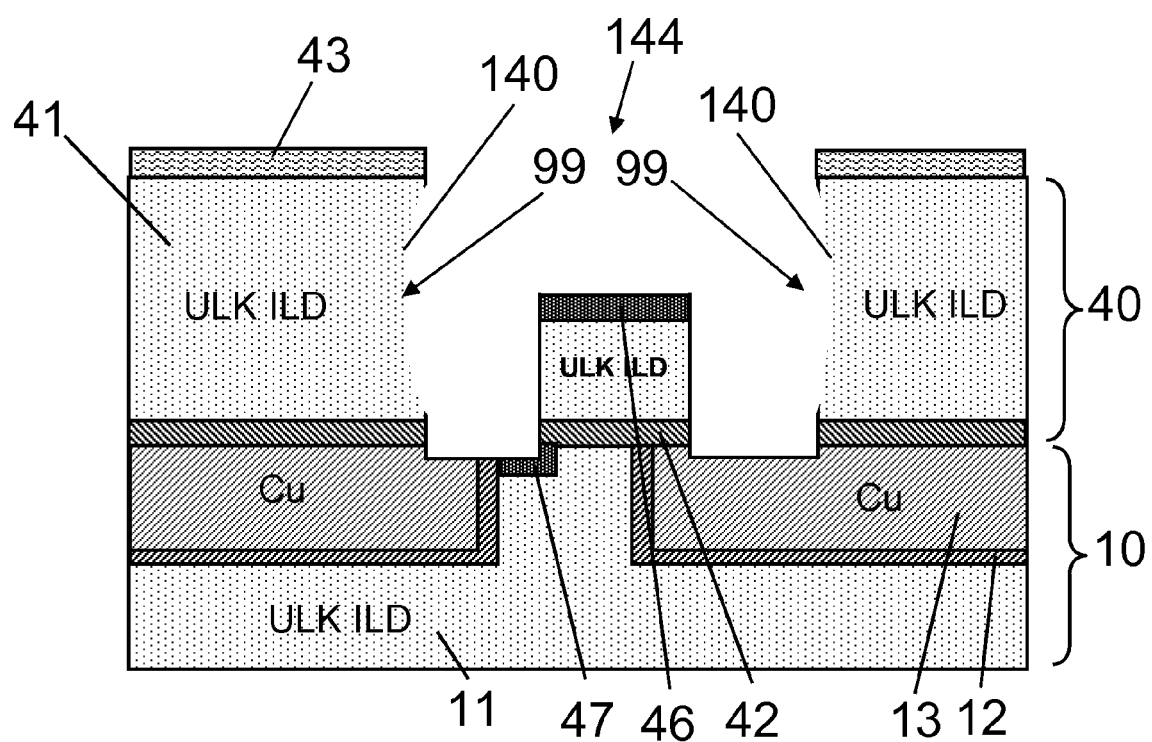
FIG. 9 is a schematic illustration of process induced dielectric damage of a sidewall area as is known in the art.
Figure 10:
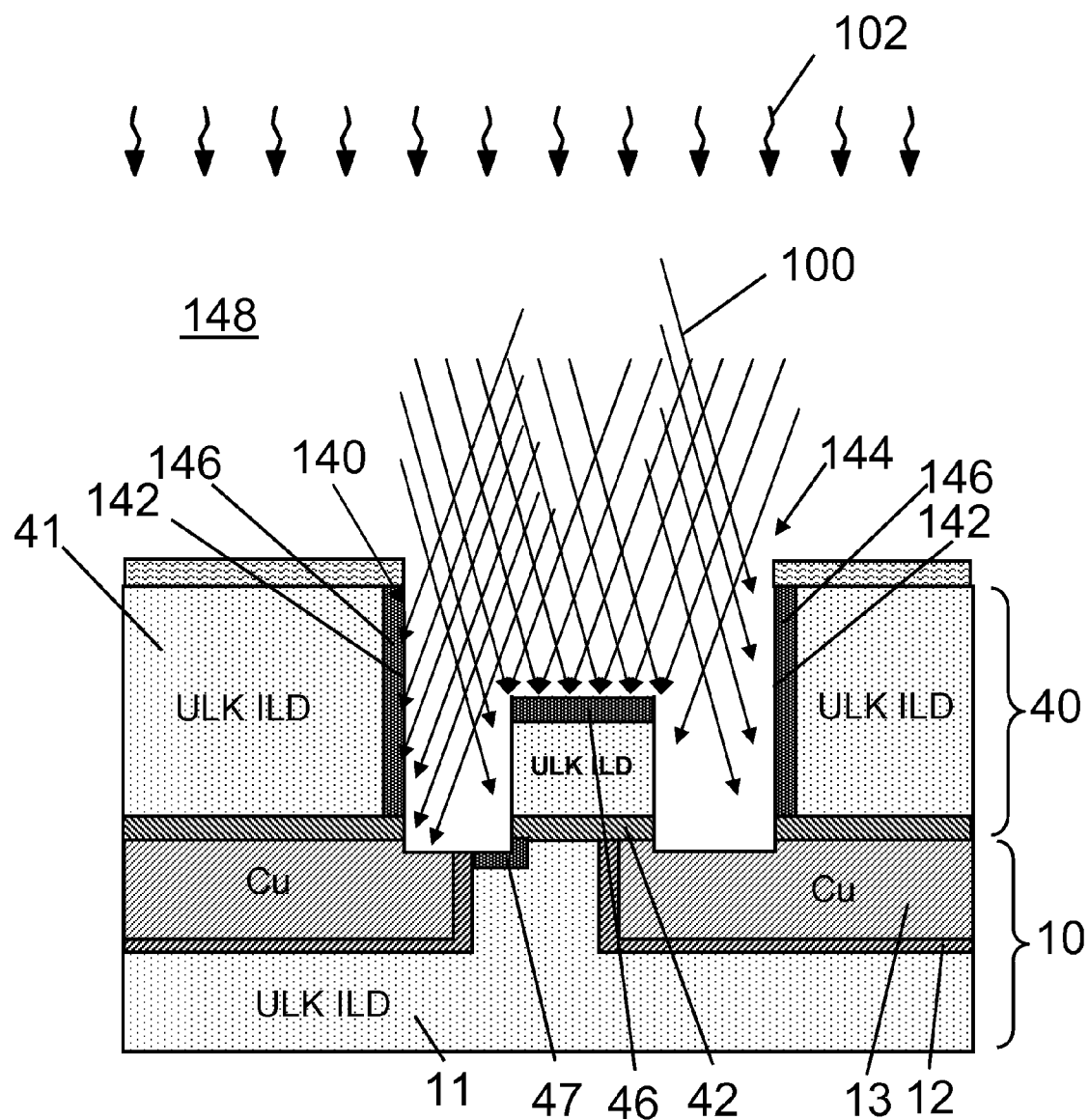
FIG. 10 is a schematic illustration of a method of repairing process induced dielectric damage from forming an interconnect structure according to yet another embodiment of the invention.
Figure 11:
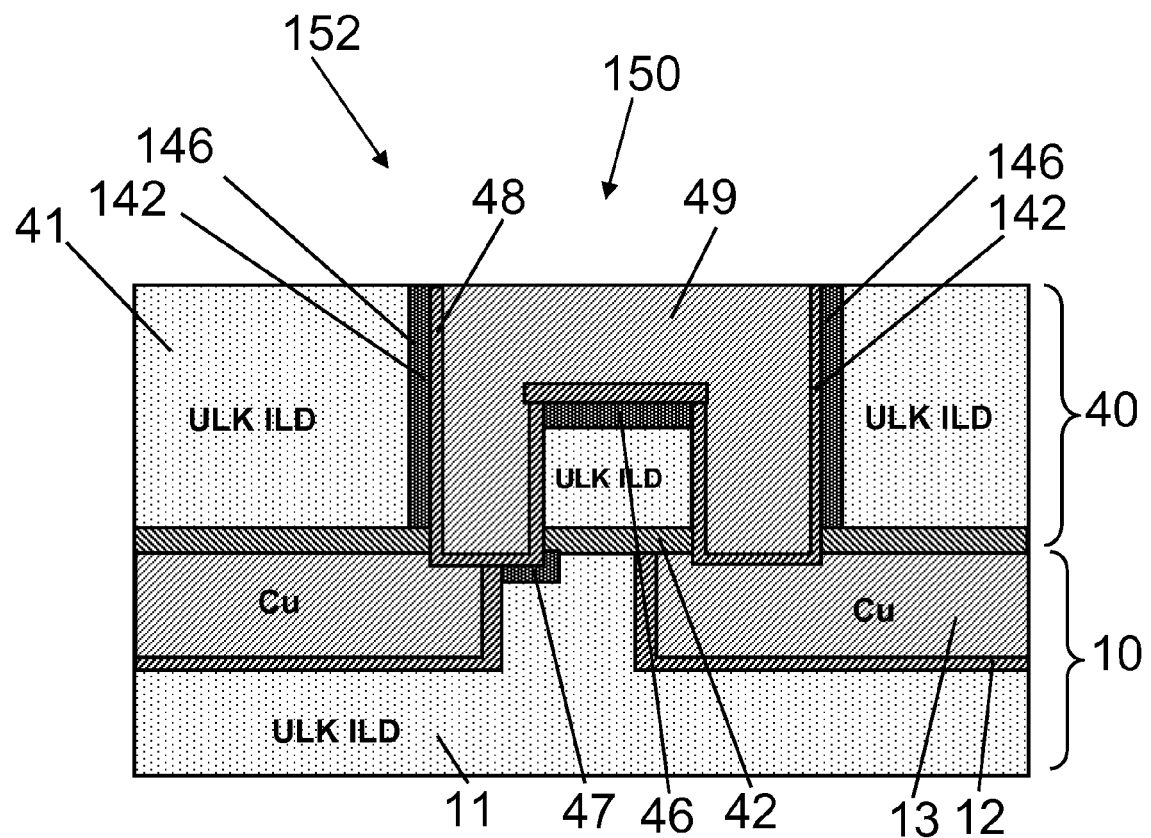
FIG. 11 is a schematic illustration of a method of repairing according to another embodiment of the invention.

Referring to FIGS. 9-11, an alternative embodiment of a method of repairing process induced dielectric damage from forming an interconnect structure 150 (FIG. 11) in an interlayer dielectric (ILD) material is shown. FIG. 9 shows a schematic illustration of process induced dielectric damage 99 of an exposed sidewall area 140 of a trench 144 (similar to regions 51-53 (FIG. 4)) formed in ILD material 41 as is known in the art. In this case, process induced damage 99 is in the form of an undercut under photo-mask 43.

As shown in FIG. 10, in this embodiment, a treatment 100 is provided to an exposed area of ILD material 41 to create a carbon rich area 146 by irradiating the exposed area using a gas cluster ion beam (GCIB) generated through a gas 148 including molecular species such as a straight chain or branched, aliphatic or aromatic hydrocarbon. In particular, FIG. 10 shows the structure of FIG. 9 treated by irradiation treatment 100 using GCIB generated through gas 148 including a straight chain or branched, aliphatic or aromatic hydrocarbon. As described above, ILD material 41 may include a porous material of an ultra-low dielectric constant (ULK).

For example, ILD material 41 may include silicon oxycarbide (SiCOH), methylsilsesquioxane (MSQ), hydrosilsesquioxane, hydrogenated amorphous silicon carbide (SiCH), hydrogenated amorphous silicon carbon nitride (SiCNH), and/or silicon nitride (SiNx). Treatment 100 incorporates carbon (C) in the damaged dielectric along exposed sidewall area 140. Irradiation treatment 100 results in a carbon-rich area 146 that is substantially hydrophobic after the treatment.

Irradiation treatment 100 may include an angled implant to achieve irradiation of exposed sidewall surface 142. As illustrated, irradiation treatment 100 may also achieve densified areas 46, 47, as described above. In one embodiment, irradiation 100 may include applying the GCIB at a dosage of approximately between 0.1 and $10.0 \times 10^{15}$ ion-clusters/cm$^2$. However, other dosages may also be possible. In one embodiment, irradiation 100 includes accelerating the GCIB at a voltage of approximately between 5.0 and 60 KeV, and preferably approximately between 5 and 30 KeV. However, other energy levels may also be employed. The energy level employed determines the depth to which carbon from the hydrocarbon species is embedded.

In one embodiment, the aliphatic hydrocarbon may include, but is not limited to: methane (CH4), ethane (C2H6), propane (C3H8) and/or ethylene (C2H4). Other hydrocarbon species may also be employed. The gas may further include an inert gas such as one or more of argon and krypton.

In addition to the organic aliphatic or aromatic hydrocarbon based GCIB irradiation 100, according to one embodiment, densified area(s) 46, 47 and carbon-rich area 146, now including carbon (C), may be stabilized by exposing the densified area(s) 46, 47 and carbon-rich area 146 to irradiation 102 in a temperature between 200 and 400° C. Irradiation 102 may include, for example, e-beam irradiation having a landing energy higher than a bond-breaking energy of Si—OH, SiH or Si—CH3, or ultra-violet (UV) irradiation having a wavelength between 170 and 300 nm, and preferably between 190 and 250 nm.

As shown in FIG. 11, densified area(s) 46, 47 and carbon-rich 146 may be subsequently metallized, as described above relative to FIGS. 6-8. The resulting semiconductor device 152 includes at least one interconnect structure 150 formed on ILD material 41, where the interconnect structure includes one or more carbon-rich areas 146 formed on sidewall surface 142 of the interconnect structure.

The above-described treatment of FIGS. 9-11 using the hydrocarbon species offers a potential avenue of repairing sidewall surface 142 damage induced by ash chemistries, thereby recovering the dielectric constant, and limiting the dimensional loss from wet cleans. In addition, the process limits the amount of undercut, thereby ensuring good PVD liner 148 coverage, defect free plating, and better dimensional control. In addition, as noted above, sidewall surface 142 is substantially hydrophobic, and hence less sensitivity to moisture uptake and associated k changes.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of repairing process induced dielectric damage during forming of an interconnect structure in an interlayer dielectric (ILD) material, the method comprising:
    providing a treatment to an exposed sidewall area of the ILD material to create a carbon-rich area by irradiating the exposed sidewall area with a gas cluster ion beam (GCIB) generated through a gas including a straight chain or branched, aliphatic or aromatic hydrocarbon, wherein the ILD material includes a porous material of an ultra-low dielectric constant (ULK), and wherein the porous material has pore diameters of 1 to 2 nm;
    stabilizing the carbon-rich area by exposing the carbon-rich area to e-beam irradiation in a temperature between 200 and 400° C.; and
    metallizing the carbon-rich area.

2. The method of claim 1, wherein the ILD material is selected from the group consisting of: silicon oxycarbide (SiCOH), methylsilsesquioxane (MSQ), hydrosilsesquioxane, hydrogenated amorphous silicon carbide (SiCH), hydrogenated amorphous silicon carbon nitride (SiCNH), and silicon nitride (SiNx).

3. The method of claim 1, wherein the GCIB irradiating comprises applying the GCIB at a dosage of approximately between 0.1 and $10.0 \times 10^{15}$ ion-clusters/cm$^2$.

4. The method of claim 1, wherein the GCIB irradiating comprises accelerating the GCIB at a voltage of approximately between 5.0 and 60 KeV.

5. The method of claim 4, wherein the GCIB irradiating comprises accelerating the GCIB at a voltage of approximately between 5 and 30 KeV.

6. The method of claim 1, wherein the gas further includes an inert gas.

7. The method of claim 6, wherein the inert gas comprises one or more gases of argon and krypton.

8. The method of claim 1, wherein the aliphatic hydrocarbon includes at least one of the following: methane (CH4), ethane (C2H6), propane (C3H8) and ethylene (C2H4).

9. The method of claim 1, wherein the another irradiation includes e-beam irradiation having a landing energy higher than a bond-breaking energy of Si—OH, SiH or Si—CH3.

10. The method of claim 1, wherein the exposed sidewall area is substantially hydrophobic after the treatment.

* * * * *

UNITED STATES PATENT AND TRADEMARK OFFICE
CERTIFICATE OF CORRECTION

| | | |
|---|---|---|
| PATENT NO. | : 7,838,428 B2 | Page 1 of 1 |
| APPLICATION NO. | : 11/609040 | |
| DATED | : November 23, 2010 | |
| INVENTOR(S) | : Chen et al. | |

It is certified that error appears in the above-identified patent and that said Letters Patent is hereby corrected as shown below:

On Column 10, line 47:

Delete:
"another"
Insert:
-- e-beam --

On Column 10, line 52:

Insert:
-- 11. The method of claim 1, wherein the e-beam irradiation includes ultra-violet (UV) irradiation having a wavelength between 170 and 300nm.
12. The method of claim 11, wherein the UV irradiation has a wavelength between 170 and 250nm. --

Signed and Sealed this
First Day of February, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,838,428 B2 | Page 1 of 2 |
| APPLICATION NO. | : 11/609040 | |
| DATED | : November 23, 2010 | |
| INVENTOR(S) | : Chen et al. | |

It is certified that error appears in the above-identified patent and that said Letters Patent is hereby corrected as shown below:

Delete the title page and substitute therefore the attached title page showing the corrected number of claims in patent.

On Column 10, line 47:

Delete:
"another"
Insert:
-- e-beam --

On Column 10, line 52:

Insert:
-- 11. The method of claim 1, wherein the e-beam irradiation includes ultra-violet (UV) irradiation having a wavelength between 170 and 300nm.
12. The method of claim 11, wherein the UV irradiation has a wavelength between 170 and 250nm. --

Signed and Sealed this
First Day of March, 2011

David J. Kappos
*Director of the United States Patent and Trademark Office*

(12) United States Patent
Chen et al.

(10) Patent No.: US 7,838,428 B2
(45) Date of Patent: Nov. 23, 2010

(54) METHOD OF REPAIRING PROCESS INDUCED DIELECTRIC DAMAGE BY THE USE OF GCIB SURFACE TREATMENT USING GAS CLUSTERS OF ORGANIC MOLECULAR SPECIES

(75) Inventors: Shyng-Tsong Chen, Patterson, NY (US); Nancy R. Klymko, Hopewell Junction, NY (US); Anita Madan, Danbury, CT (US); Sanjay Mehta, Niskayuna, NY (US); Steven E. Molis, Patterson, NY (US)

(73) Assignee: International Business Machines Corporation, Armonk, NY (US)

(*) Notice: Subject to any disclaimer, the term of this patent is extended or adjusted under 35 U.S.C. 154(b) by 648 days.

(21) Appl. No.: 11/609,040

(22) Filed: Dec. 11, 2006

(65) Prior Publication Data

US 2007/0224824 A1 Sep. 27, 2007

Related U.S. Application Data

(63) Continuation-in-part of application No. 11/308,422, filed on Mar. 23, 2006.

(51) Int. Cl.
*H01L 21/311* (2006.01)
(52) U.S. Cl. ............... 438/700; 438/637; 257/E23.145
(58) Field of Classification Search .......... 257/E23.145, 257/E23.15, E23.148; 438/700, 637, 409, 438/960, 618
See application file for complete search history.

(56) References Cited

U.S. PATENT DOCUMENTS

| | | | |
|---|---|---|---|
| 5,814,194 A | | 9/1998 | Deguchi et al. |
| 5,970,376 A * | | 10/1999 | Chen .................. 438/637 |
| 6,284,644 B1 * | | 9/2001 | Aug et al. .................. 438/623 |
| 6,613,240 B2 | | 9/2003 | Skinner et al. |
| 7,538,028 B2 * | | 5/2009 | Sandhu et al. .................. 438/638 |
| 2003/0232495 A1 * | | 12/2003 | Moghadam et al. ......... 438/623 |

(Continued)

OTHER PUBLICATIONS

Hautala et al., "Infusion Processing: An Alternative to Plasma Technology for Semiconductor Device Manufacturing", Electrochemical Society Symposium on ULSI Process Integration IV, May 2005, Quebec, Canada, PV Jun. 2005, p. 118.

(Continued)

*Primary Examiner*—Thao P. Le
(74) *Attorney, Agent, or Firm*—Wenjie Li; Hoffman Warnick LLC

(57) ABSTRACT

When an interconnect structure is built on porous ultra low k (ULK) material, the bottom and/or sidewall of the trench and/or via is usually damaged by a following metallization or cleaning process which may be suitable for dense higher dielectric materials. Embodiments of the present invention may provide a method of repairing process induced dielectric damage from forming an interconnect structure on an interlayer dielectric (ILD) material. The method includes treating an exposed area of the ILD material to create a carbon-rich area, and metallizing the carbon-rich area. One embodiment includes providing treatment to an exposed sidewall area of the ILD material to create a carbon-rich area by irradiating the exposed area using a gas cluster ion beam (GCIB) generated through a gas including a straight chain or branched, aliphatic or aromatic hydrocarbon, and metallizing the carbon-rich area.

12 Claims, 11 Drawing Sheets